(12) United States Patent
Yu et al.

(10) Patent No.: US 7,238,976 B1
(45) Date of Patent: Jul. 3, 2007

(54) SCHOTTKY BARRIER RECTIFIER AND METHOD OF MANUFACTURING THE SAME

(75) Inventors: Ho-Yuan Yu, Saratoga, CA (US); Chong-Ming Lin, Sunnyvale, CA (US)

(73) Assignee: QSpeed Semiconductor Inc., Santa Clara, CA (US)

( * ) Notice: Subject to any disclaimer, the term of this patent is extended or adjusted under 35 U.S.C. 154(b) by 0 days.

(21) Appl. No.: 10/869,718

(22) Filed: Jun. 15, 2004

(51) Int. Cl.
*H01L 29/80* (2006.01)
*H01L 27/095* (2006.01)

(52) U.S. Cl. ............... 257/260; 257/266; 257/272; 257/476; 257/E33.051; 257/E29.148; 257/E29.338

(58) Field of Classification Search ............ 257/104, 257/471, 474, 475, 476, 480, 481, 482, 485, 257/486, 260, 266, 272, E33.051, E29.148, 257/E29.338
See application file for complete search history.

(56) References Cited

U.S. PATENT DOCUMENTS

| | | | | |
|---|---|---|---|---|
| H000040 H | * | 4/1986 | Buchanan et al. ......... 257/484 |
| 4,707,719 A | * | 11/1987 | Whight ..................... 257/489 |
| 5,371,400 A | * | 12/1994 | Sakurai ..................... 257/478 |
| 6,184,545 B1 | * | 2/2001 | Werner et al. ............. 257/109 |
| 6,221,688 B1 | * | 4/2001 | Fujihira et al. ............. 438/92 |
| 6,252,288 B1 | * | 6/2001 | Chang ........................ 257/471 |
| 6,307,244 B1 | * | 10/2001 | Shikata ....................... 257/471 |
| 6,501,146 B1 | * | 12/2002 | Harada ....................... 257/475 |
| 6,603,153 B2 | * | 8/2003 | Francis et al. ............. 257/104 |
| 6,707,127 B1 | * | 3/2004 | Hshieh et al. ............. 257/483 |
| 6,710,418 B1 | * | 3/2004 | Sapp .......................... 257/471 |
| 6,768,138 B1 | * | 7/2004 | Kitada et al. ............... 257/127 |
| 6,897,133 B2 | * | 5/2005 | Collard ....................... 438/570 |
| 7,101,739 B2 | * | 9/2006 | Lanois ....................... 438/141 |
| 2002/0008246 A1 | * | 1/2002 | Francis et al. ............. 257/104 |
| 2002/0125541 A1 | * | 9/2002 | Korec et al. ............... 257/471 |
| 2002/0190338 A1 | * | 12/2002 | Skocki ....................... 257/471 |
| 2003/0006472 A1 | * | 1/2003 | Buchanan et al. ......... 257/475 |
| 2003/0020134 A1 | * | 1/2003 | Werner et al. ............. 257/471 |
| 2003/0096464 A1 | * | 5/2003 | Lanois ....................... 438/173 |
| 2003/0160262 A1 | * | 8/2003 | Kitada et al. ............... 257/127 |
| 2003/0218230 A1 | * | 11/2003 | Takahashi et al. ......... 257/471 |
| 2004/0046224 A1 | * | 3/2004 | Rossel et al. .............. 257/471 |
| 2004/0110330 A1 | * | 6/2004 | Collard ....................... 438/167 |
| 2005/0029614 A1 | * | 2/2005 | Wu ............................ 257/471 |
| 2005/0073030 A1 | * | 4/2005 | Inoue et al. ............... 257/656 |
| 2006/0226504 A1 | * | 10/2006 | Hatakeyama et al. ...... 257/472 |

* cited by examiner

*Primary Examiner*—Ngân V. Ngô
(74) *Attorney, Agent, or Firm*—Morgan, Lewis & Bockius LLP

(57) ABSTRACT

A Schottky barrier rectifier, in accordance with embodiments of the present invention, includes a first conductive layer and a semiconductor. The semiconductor includes a first doped region, a second doped region and a plurality of third doped regions. The second doped region is disposed between the first doped region and the first conductive layer. The plurality of third doped regions are disposed in the second doped region. The first doped region of the semiconductor is heavily doped with a first type of dopant (e.g., phosphorous or arsenic). The second doped region is moderately doped with the first type of dopant. The plurality of third doped regions are moderately to heavily doped with a second type of dopant.

20 Claims, 8 Drawing Sheets

US 7,238,976 B1

SCHOTTKY BARRIER RECTIFIER AND METHOD OF MANUFACTURING THE SAME

BACKGROUND OF THE INVENTION

Referring to FIG. 1, a plot of the current-voltage characteristics of an exemplary p-n junction (e.g., semiconductor junction) diode and an exemplary Schottky (e.g., semiconductor-metal junction) diode, in accordance with the conventional art, is shown. It is appreciated that the plots are for illustrative purposes and do not necessary represent a particular p-n junction diode or Schottky diode. In a forward-biased state, the p-n junction diode typically has a fully conducting voltage drop of approximate 1V, for large currents. In a reverse-biased state, a leakage current, which is proportional to the junction area, flows in the p-n junction diode. The leakage current exhibits a strong temperature dependence, approximately doubling for every 10° C. rise in temperature. If the reverse-biased voltage exceeds the breakdown voltage of the device, the reverse current increases rapidly.

The leakage current characteristics and breakdown voltage of p-n junction diodes may readily be utilized in rectifier applications and the like. However, the voltage drop across the p-n junction diode during forward-biasing results in significant power consumption when relatively large currents flow through the p-n junction diode.

In a forward-biased state, the Schottky diode typically exhibits a fully conducting voltage drop of approximate 0.5V, for large currents. In a reverse-biased state, a substantial leakage current flows at relatively low reverse voltages. The Schottky diode also exhibits a weak "knee" as the device enters breakdown. Thus, the Schottky diode suffers from both a higher leakage current and a low breakdown voltage in the reverse-biased direction, as compared to a p-n junction diode.

The reduced voltage drop across the Schottky diode during forward-biasing would make the device advantageous for use in rectifier applications and other similar applications. However, the substantial leakage current and relatively low breakdown voltage limits use of the Schottky diode to low voltage applications.

Thus, in the conventional art the use of diodes, in rectifier applications and the like, suffer from higher forward voltage drop, higher leakage current and/or low breakdown voltage.

SUMMARY OF THE INVENTION

Accordingly, embodiments of the present invention are directed toward rectifiers exhibiting relatively low voltage drop when forward-biased like a Schottky diode, low leakage current when reverse-biased and a high breakdown voltage, as compared to p-n junction diodes. In one embodiment, the rectifier includes a first conductive layer and a semiconductor. The semiconductor includes a first doped region, a second doped region and a plurality of third doped regions. The second doped region is disposed between the first doped region and the first conductive layer. The plurality of third doped regions are disposed in the second doped region. The first doped region of the semiconductor is heavily doped with a first type of dopant (e.g., phosphorous or arsenic). The second doped region is moderately doped with the first type of dopant. The plurality of third doped regions are moderately to heavily doped with a second type of dopant.

In one embodiment, a method of fabricating the rectifier includes epitaxial depositing a semiconductor layer upon a substrate. The epitaxial deposited semiconductor layer has a first concentration of a first type of dopant and the substrate has a second concentration of the first type of dopant. A plurality of trenches are etched into the epitaxial deposited semiconductor layer. A portion of the epitaxial deposited semiconductor layer proximate the bottom of the trenches is implanted with a second type of dopant. A dielectric is deposited in the trenches and a first metal layer is deposited upon the epitaxial deposited semiconductor layer.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Figure 1:
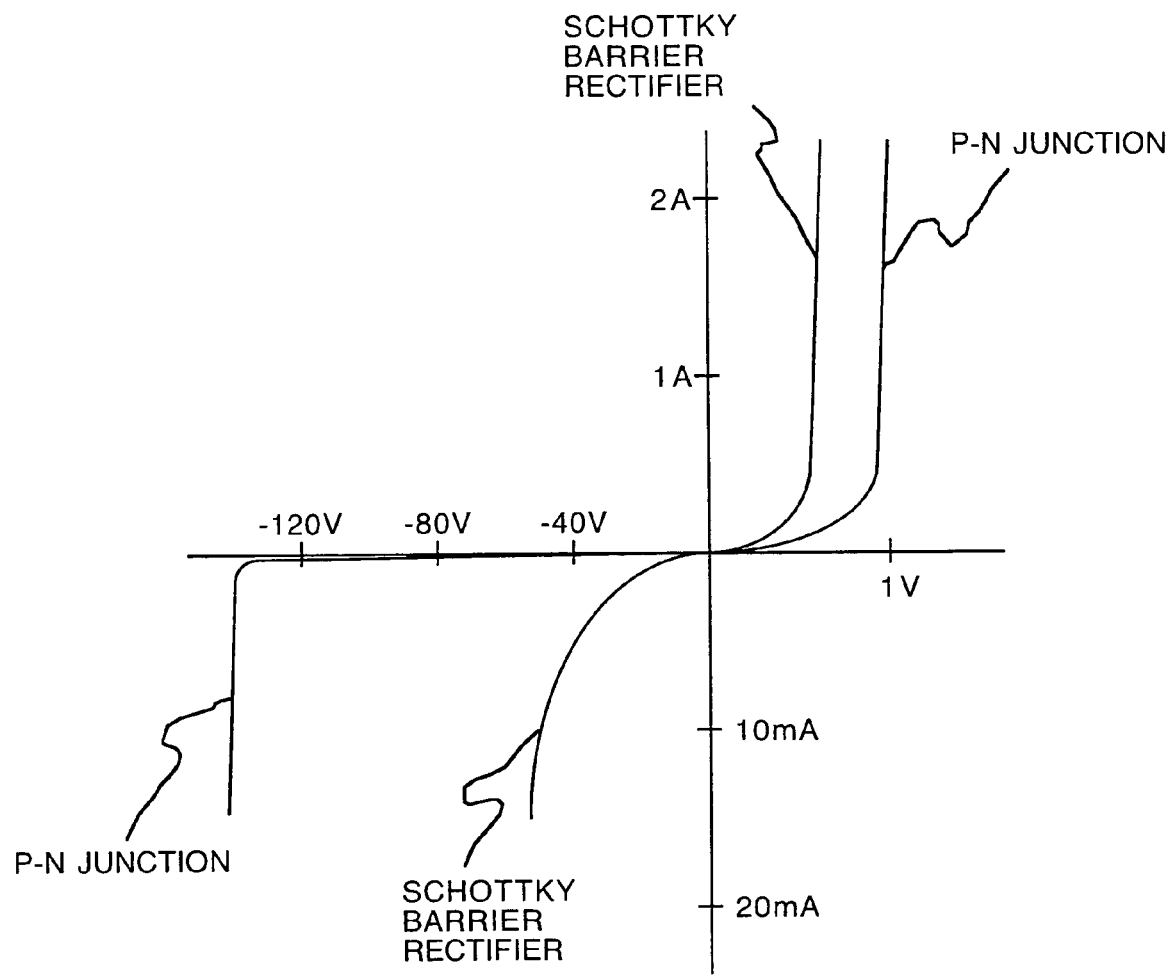
FIG. 1 shows a plot of the current-voltage characteristics of an exemplary p-n junction (e.g., semiconductor junction) diode and a Schottky (e.g., semiconductor-metal junction) diode, in accordance with the conventional art.

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Referring now to FIGS. 2A, 2B, 3A and 3B, sectional views of a Schottky barrier rectifier, in accordance with embodiments of the present invention, are shown. The Schottky barrier rectifier includes a semiconductor 210, 215, 220 and a first conductive layer 205 (e.g., anode and anode contact). The semiconductor 210, 215, 220 includes a first doped region 210, a second doped region 215 (e.g., cathode) and a plurality of third doped regions 220 (e.g., a control gate).

The first and second doped regions 210, 215 may be disposed proximate each other. The first conductive layer 205 may be disposed upon a surface of the second dope region 215 opposite the first doped region 210. The plurality of third doped regions 220 may be disposed within the second doped regions 215. In one implementation, the plurality of third doped regions 220 may be a plurality of substantially parallel linear structures. In another implementation, the plurality of third doped region 220 may be a plurality of substantially concentric circular structures.

The first conductive layer 205 and the doping concentration of the second doped region 215 are selected to form a Schottky diode at the interface there between. In a first implementation, the first doped region 210 may be silicon (Si) heavily doped with phosphorous or arsenic (e.g., N+). The second doped region 215 may be silicon moderately doped with phosphorous or arsenic (e.g., N). The plurality of third doped regions 220 may be silicon moderately to heavily doped with boron (e.g., P or P+). In a second implementation (not shown), the first doped region 210 may be silicon heavily doped with boron (e.g., P+). The second doped region 215 may be silicon moderately doped with boron (e.g., P). The plurality of third doped regions 220 may be silicon moderately to heavily doped with phosphorous or arsenic (e.g., N or N+). Although embodiments of the present invention are described with reference to silicon, it appreciated that embodiments of the present invention may also utilize similarly doped type III-V compounds as the semiconductor materials.

The first conductive layer 205 may include a plurality of layers of metal, silicide and/or the like. In one implementation, a first layer 205a (e.g., bottom layer) may include titanium (Ti), tungsten (W), platinum (Pt), copper (Cu), nickel (Ni), cobalt (Co), molybdenum (Mo) and/or the like, deposited on the surface of the second doped region 215. A second layer 205c (e.g., top layer) may include nickel-gold (Ni/Au), nickel-silver (Ni/Ag), aluminum (Al), copper (Cu) and/or the like deposited on the first layer. If the second layer includes aluminum, a third layer 205b (e.g., middle layer) of titanium nitride (TiN), titanium (Ti), titanium tungsten (TiW) and/or the like may be deposited between the first 205a and second 205c layers. The second layer containing nickel-gold (Ni/Au), nickel-silver (Ni/Ag) and/or the like is adapted for making solder connections to the anode. The second layer containing aluminum (Al) and/or the like is adapted for making wire-bond connections to the anode.

The Schottky barrier rectifier may also include a second conductive layer 225 (e.g., cathode contact) and a plurality of insulator regions 230. The plurality of insulator regions 230 may be disposed in the second doped region, wherein each insulator region is disposed between a corresponding one of the plurality of third doped regions 220 and the first conductive layer 205. The second conductive layer 225 (e.g., cathode contact) may be disposed on the first doped region 210, opposite the second 215 and third doped regions 220. It is also appreciated that additional insulative layers 235 may provide for isolation in the periphery of the device.

Figure 2A:
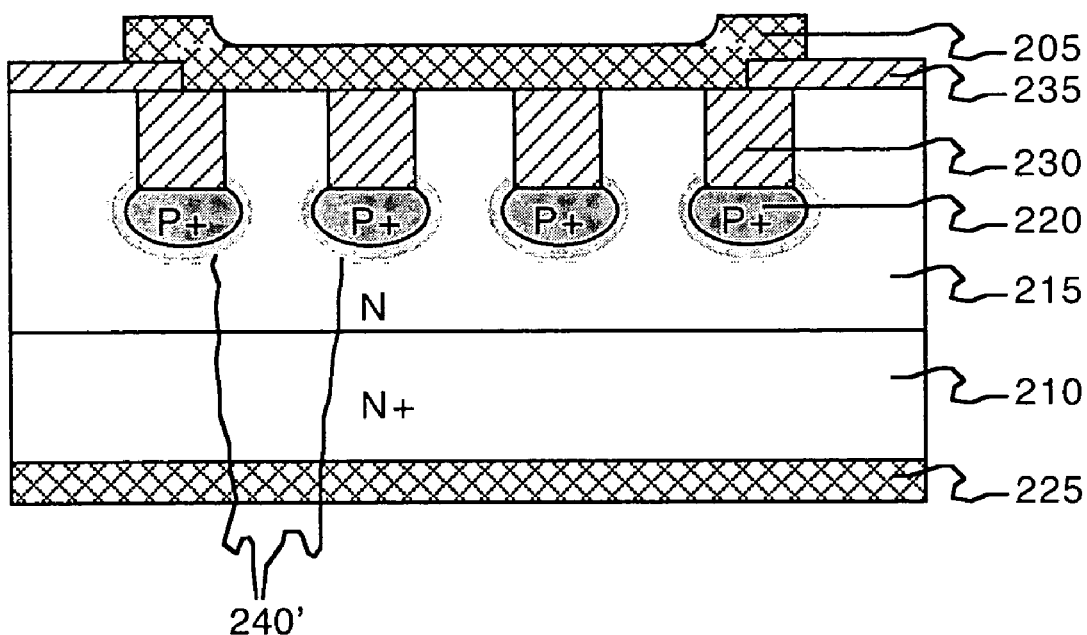
FIGS. 2A, 2B, 2C, 3A and 3B show sectional views of a Schottky barrier rectifier, in accordance with embodiments of the present invention.
Figure 2B:
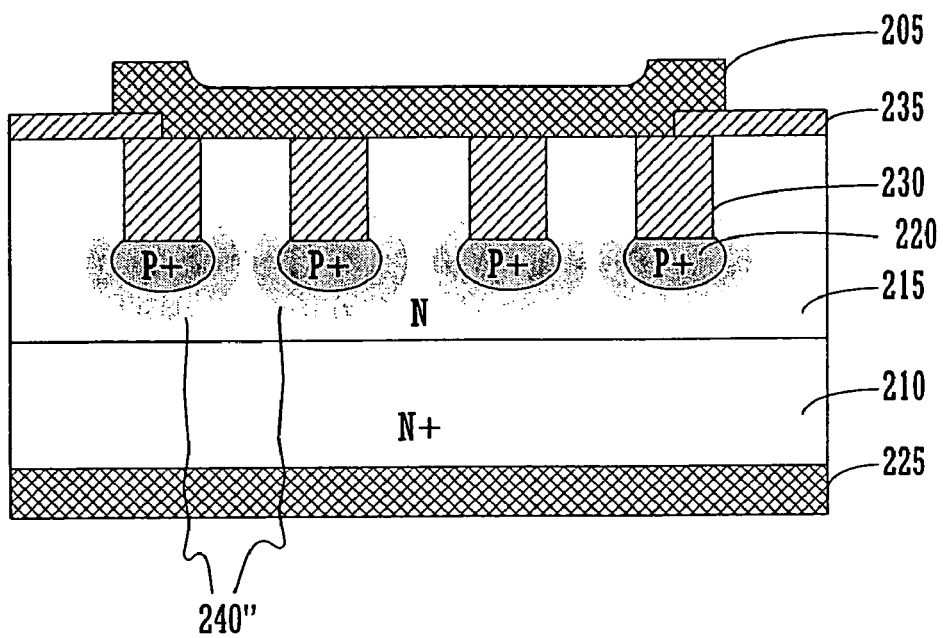
Figure 2C:
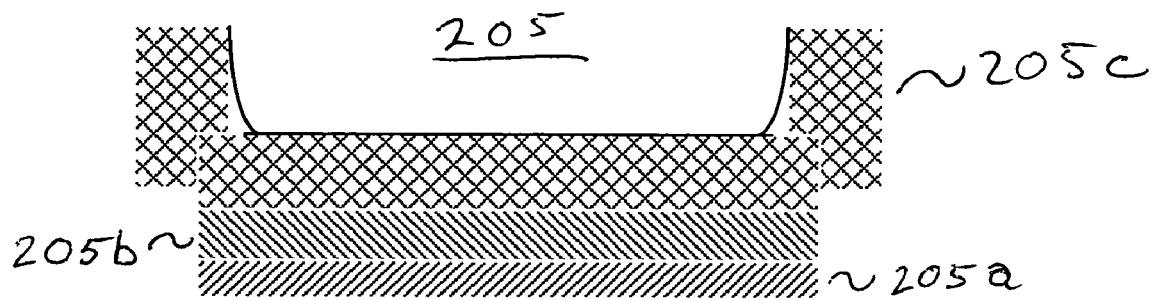

A depletion mode Schottky barrier rectifier is depicted in FIGS. 2A and 2B. The doping concentration level of the plurality of third doped regions 220, with respect to the doping concentration of the second doped region 215, may be such that depletion regions 240' formed there between extend partially into the second doped region 215, in an equilibrium state. More specifically, the depletion regions 240' associated with adjacent ones of the third doped regions 215 do not overlap in the second doped region 220. Hence, when the control gate and the cathode are at the same voltage potential a plurality of conduction channels are present between the plurality of third doped regions 220, as depicted in FIG. 2A. Accordingly, when the Schottky barrier, formed by the first conductive layer 205 (e.g., anode) and the semiconductor (e.g., cathode) 210, 215, is forward-biased and a gate current is supplied to the control gate an "on-state" current flows. The on-state current flows from the first conductive layer 205, through the conduction channels between the third conductive regions 220, through the first doped region 210 and into the second conductive layer 225.

When the junction between the control gate and the cathode is reverse-biased, the width of the depletion regions 240" increase, as depicted in FIG. 2B. Therefore, the conduction channels between the plurality of third doped regions 220 are "pinched off." Thus, when the Schottky barrier is reverse-biased, the leakage current is blocked by the pinched off channels. The depletion regions 240" formed between the second doped region 215 and the plurality of third doped regions 220, which is spaced apart from the Schottky barrier, also results in relatively large breakdown voltage.

Figure 3A:
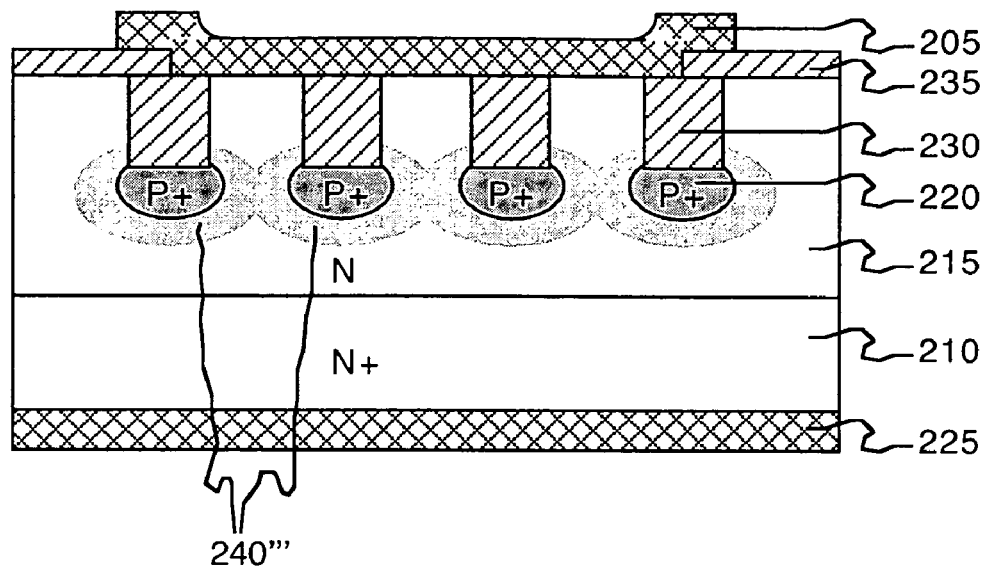
Figure 3B:
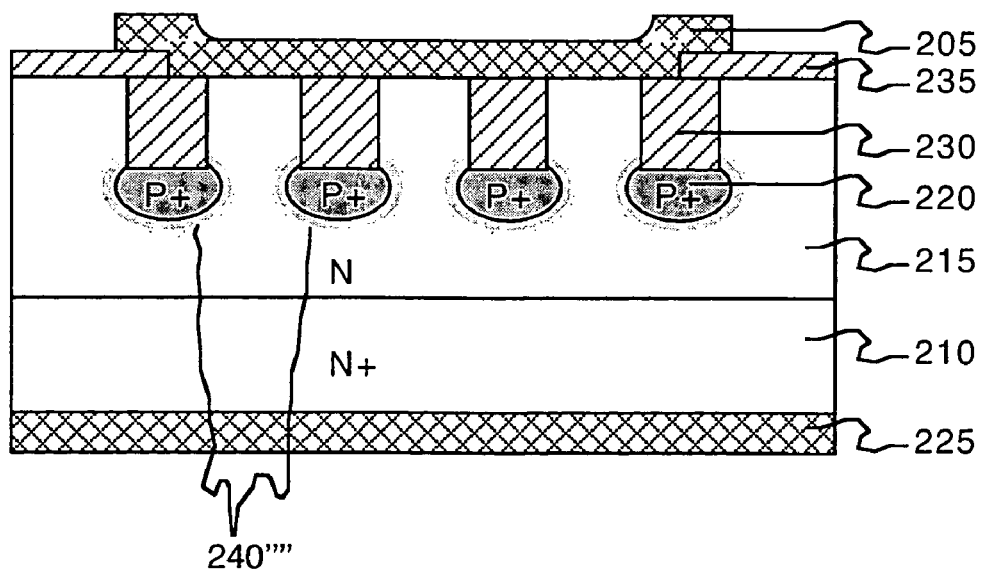

An enhancement mode Schottky barrier rectifier is depicted in FIGS. 3A and 3B. The doping concentration level of the plurality of third doped regions, with respect to the doping concentration of the second doped region, may be such that adjacent depletion regions 240''' formed there between merge into a single continuous depletion region across the second doped region 215, in an equilibrium state. Hence, when the control gate and the cathode are at the same voltage potential the conduction channels are pinched off, as depicted in FIG. 3A. Accordingly, when the Schottky barrier is reverse-biased the leakage current is blocked. More specifically, the pinch off of the channels prevents the conduction of leakage current from the cathode to the anode.

When the control gate is at higher voltage potential than the cathode, the width of the depletion regions 240'''' decrease, as depicted in FIG. 3B. Therefore, a plurality of conduction channels are formed between the third doped regions 220. When the Schottky barrier is forward-biased, an "on-state" current flows. The on-state current flows from the first conductive layer, through the channels between the third conductive regions, through the first doped region and into the second metal layer.

Accordingly, the potential between the control gate and the cathode may advantageously be varied to selectively increase or decrease the depletion region surrounding the control gate region. When conduction channels are present between the control gates and the Schottky barrier is forward-biased, an "on-state" current flows. When the conduction channels are "pinched-off" and the Schottky barrier is reverse-biased, the "off-state" current is substantially zero. The breakdown voltage of the Schottky barrier rectifier is also substantially increased, as compared to a Schottky diode and a p-n junction diode.

Figure 4A:
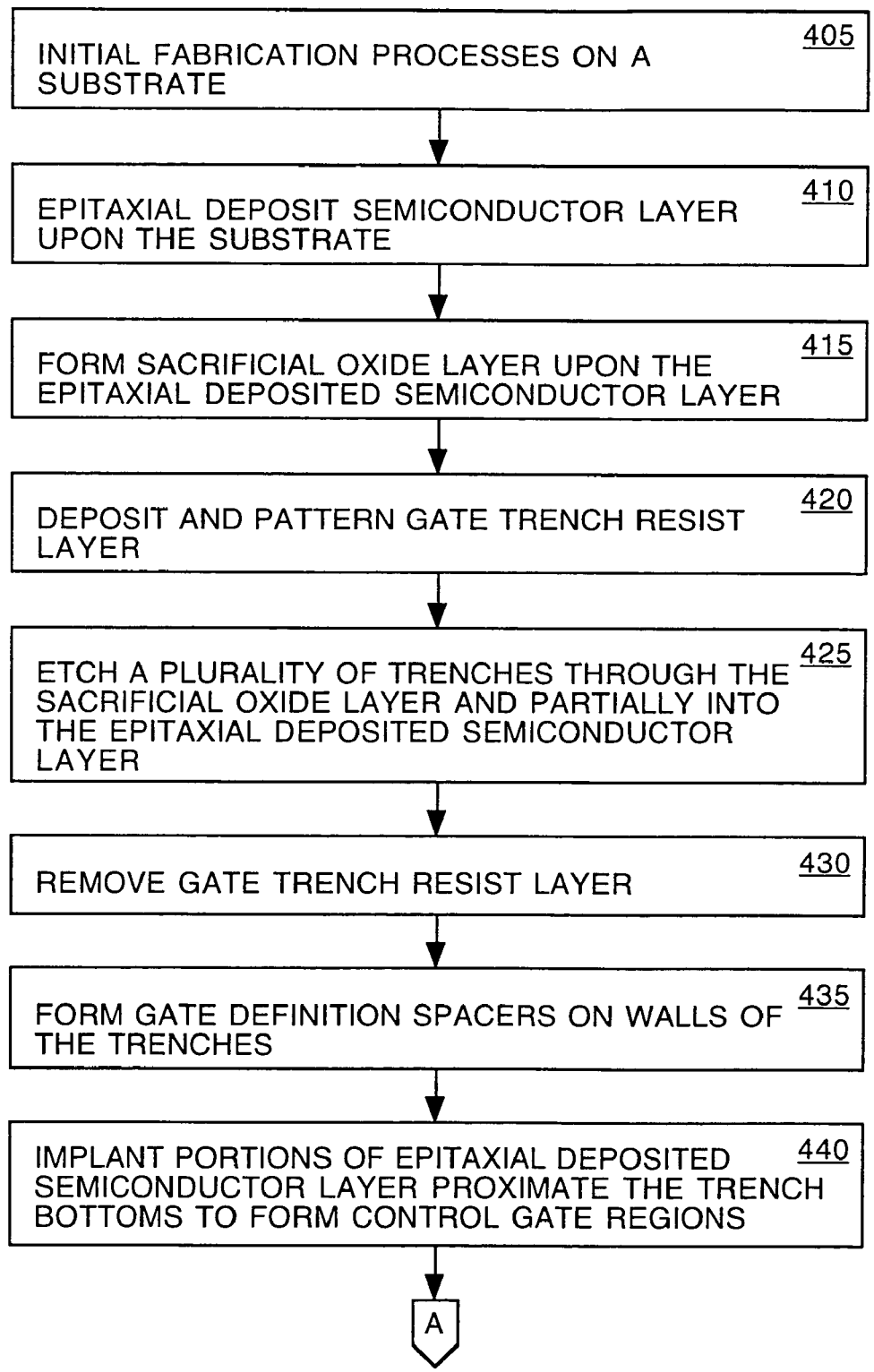
FIGS. 4A, 4B and 4C show a flow diagram of step of a method of manufacturing a Schottky barrier rectifier, in accordance with one embodiment of the present invention.
Figure 4B:
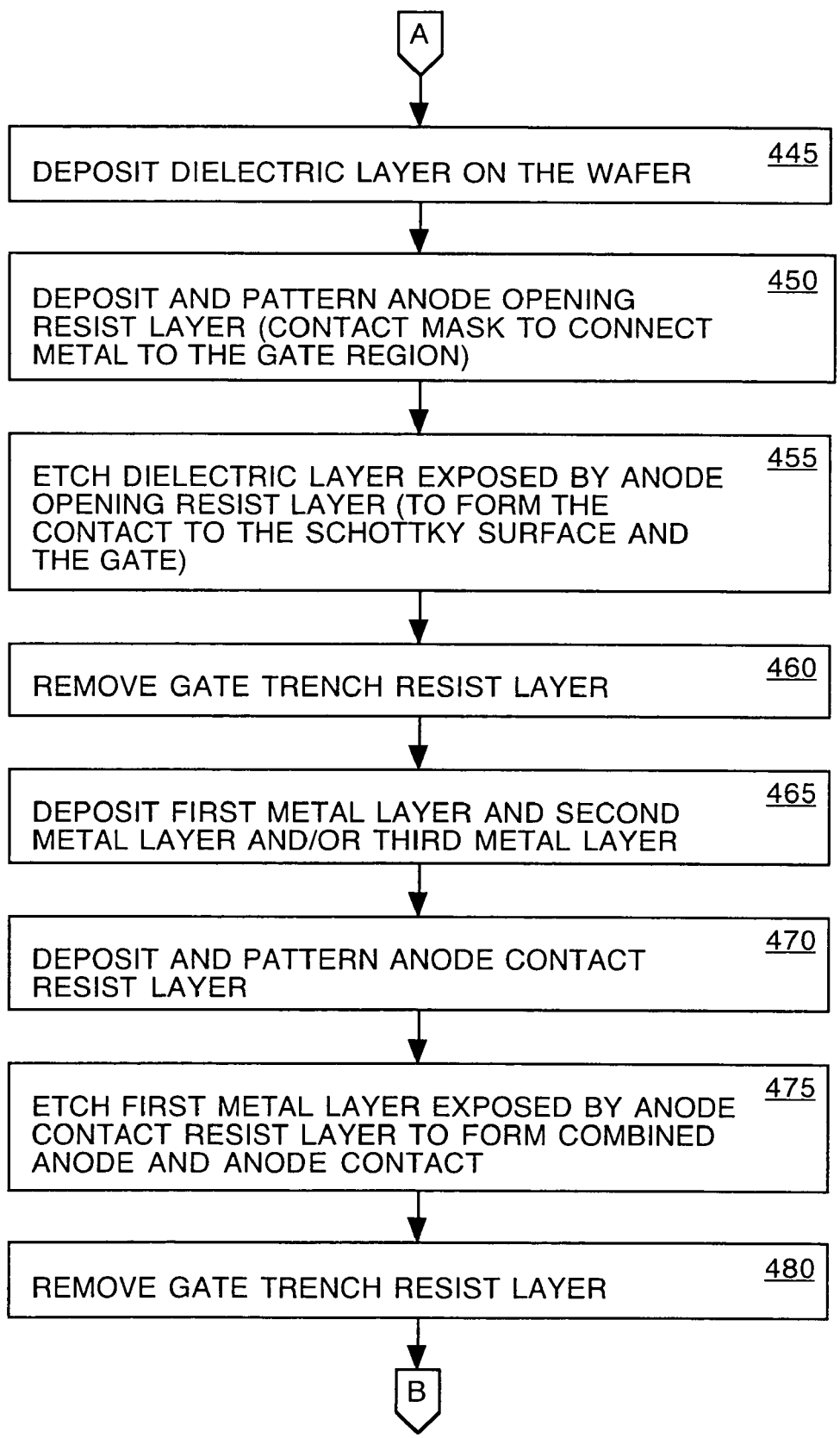
Figure 4C:
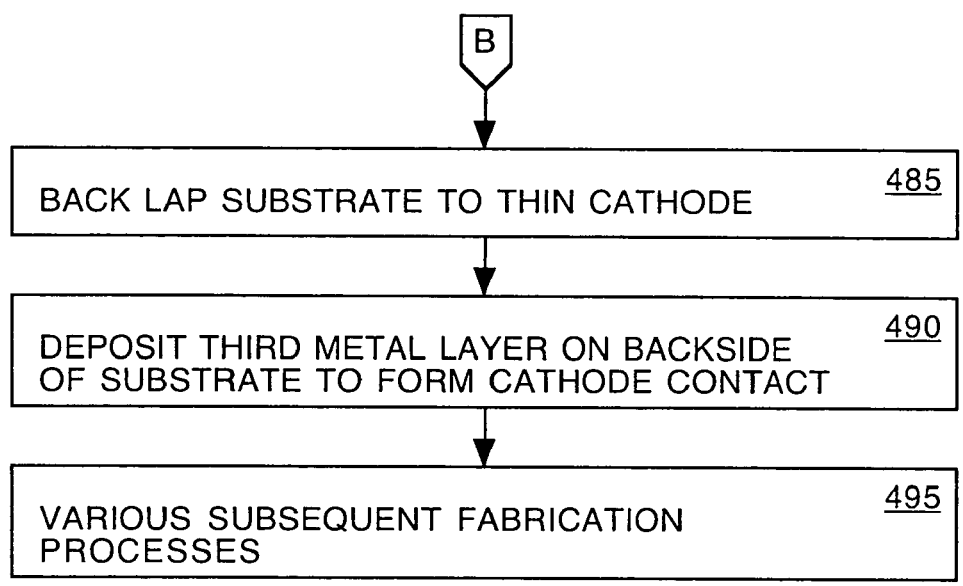

Referring now to FIGS. 4A, 4B and 4C, a flow diagram of a method of manufacturing a Schottky barrier rectifier, in accordance with one embodiment of the present invention, is shown. As depicted in FIG. 4A, the fabrication process may begin, at 405, with various initial processes upon a semiconductor substrate such as cleaning, depositing, doping, etching and/or the like. The semiconductor substrate may contain a first type of dopant at a first concentration. In a first implementation, the substrate may be silicon heavily doped with phosphorous or arsenic (N+), having a concentration of approximately $5.0E16$ $cm^{-3}$ to $1.0E20$ $cm^{-3}$. In a second implementation, the substrate may be silicon heavily doped with boron (P+).

At 410, a semiconductor layer may be epitaxial deposited upon the substrate. In one implementation, an epitaxial deposited layer of approximate 30 nano-meters (nm) to 400 nm is formed upon the substrate. The epitaxial deposited semiconductor layer may contain the first type of dopant at a second concentration. The semiconductor layer may be doped by introducing the dopant into the epitaxial chamber during deposition. The epitaxial deposited semiconductor layer may also be doped by an optional high-energy implant and thermal anneal process after deposition. In the first implementation, the epitaxial deposited semiconductor layer may be silicon moderately doped with phosphorous or arsenic (N), having a concentration of approximately 5.0E14 $cm^{-3}$ to 5.0E16 $cm^{-3}$. In the second implementation, the epitaxial deposited semiconductor layer may be silicon moderately doped with boron (P).

At 415, a sacrificial oxide layer may be formed upon the epitaxial deposited semiconductor layer. In one implementation, the sacrificial oxide layer is formed by oxidizing the surface of the epitaxial deposited semiconductor layer. At 420, a first photo-resist may be deposited and patterned by any well-known lithography process to form a gate trench resist layer. In one implementation, the gate trench resist layer defines a plurality of substantially parallel linear trenches. In another implementation, the gate trench resist layer defines a plurality of substantially concentric circular trenches. At 425, the sacrificial oxide layer and a portion of the epitaxial deposited semiconductor layer exposed by the gate trench resist layer may be etched by any well-known anisotropic etching method (e.g., dry etch). The spacing between the trenches is selected such that the presence of a conduction channel, formed as a result of subsequent fabrication processes there between, may be selectively controlled by varying the potential between a gate region and cathode region. The depth of the trenches is also selected such that the depletion region associated with a subsequently formed control gate is separated from a Schottky barrier formed in subsequent processes. In one implementation, the trenches are approximately 5 nm deep and are spaced approximately 5 nm apart. At 430, the trench gate resist layer may be removed utilizing an appropriate resist stripper or resist ashing process.

At optional process 435, gate definition spacers are formed along the walls of the gate trenches. The gate definition spacers are described in co-pending U.S. patent application Ser. No. 10/158,326, filed May 29, 2002, by Yu et al., entitled "Structure for Reduced Gate Capacitance in a JFET," which is incorporated herein by reference in its entirety. In one implementation, an oxide is grown in the trenches. The thermally grown oxide advantageously reduces leakage current by rounding the corners of the trenches and/or repairing lattice damage due to the etching process of 425. The oxide may then be etched-back to remove the oxide along the bottom of the trenches, thereby exposing the epitaxial deposited semiconductor layer proximate the trench bottoms.

At 440 of FIG. 4A, a portion of the epitaxial deposited semiconductor layer proximate the bottom of the plurality of trenches is doped with a second dopant to form a grid of control gate regions. The second dopant may be implanted by any well-known high-energy implant process, utilizing the gate trench resist layer. In the first implementation, the dopant may be boron implanted to form gate regions having a concentration of approximately 1.0E17 $cm^{-3}$ to 1.0E19 $cm^{-3}$. In the second implementation, the dopant may be phosphorous or arsenic. The doping may be driven into a desired depth with a thermal cycle (e.g., rapid thermal anneal). If gate definition spacers are formed proximate the walls of the trenches, the lateral boundary of the implanted gate region is aligned with the surface of the gate definition spacers. During the thermal anneal process, the presence of the gate definition spacers control the final junction geometry by establishing the lateral extent of the implanted volume and by limiting the available diffusion paths. Thus, the presence of the gate definition spacers acts to shorten the length of the conduction channels formed in the second epitaxial deposited semiconductor layer between the control gate regions. The shorter conduction channel length improves the frequency response of the Schottky barrier rectifier.

The doping types and concentrations of the control gate regions and the epitaxial deposited semiconductor layer results in the generation of a depletion region proximate the interface there between. A potential applied to the control gate regions may selectively increase or decrease the width of the depletion regions. In addition, the doping levels and width between the trenches may be selected to achieve a desired forward voltage drop (e.g., on-state resistance) and reverse breakdown voltage level.

At 445 of FIG. 4B, a dielectric layer is deposited upon the wafer. In one implementation, the dielectric layer may be deposited by any well-know deposition process, such as decomposition of tetraethylorthosilicate (TEOS), high-density plasma deposition (HDP), spin-on glass (BPSG), flowable oxide and/or the like. Such deposition processes result in formation of a conformal dielectric layer that fills the gate trenches.

At 450, a second photo-resist may be deposited and patterned by any well-known lithography process to form an anode opening resist layer (e.g., contact mask to connect metal to the gate region). In one implementation, the anode opening resist layer defines an opening between the plurality of gate trenches were the anode of the device contacts the cathode (e.g., epitaxial deposited semiconductor layer and substrate). At 455, the dielectric layer exposed by the anode resist layer may be etched by any well-known anisotropic etching method (e.g., dry etch). The exposed portion of the dielectric layer is etched until the surface of the epitaxial deposited semiconductor layer is exposed (e.g., utilized to form the contact to the Schottky surface and the gate. It is appreciated that the dielectric material filling the trenches remains to form gate insulator regions. At 460, the anode opening resist layer may be removed utilizing an appropriate resist stripper or resist ashing process.

It is appreciated that gate contact openings may also be etched through the dielectric layer down to the control gate regions in a periphery region (not shown). The gate contact opening may then be filled with a gate interconnect (e.g., polysilicon) (not shown). Accordingly, independent electrical connections may be made to the control gate and the anode. Alternatively, polysilicon deposition and etch-back processes may be performed to form gate interconnect through the gate trenches between the gate definition spacers (not shown), before deposition of the dielectric layer at 445. Thus, after forming the anode opening a subsequently formed conductive layer will electrically connect the anode to the control gate region via the gate interconnects. The gate definition spacers will provide electrical isolation between the cathode and the gate interconnects. Accordingly, the control gate and anode of the Schottky barrier rectifier will effectively have a common electrical connection.

At 465, a first metal layer and a second metal layer may be deposited on the wafer. The metal layers may be deposited by any well-known method such as sputtering. In one implementation, the first metal layer may be titanium (Ti), tungsten (W), platinum (Pt), copper (Cu), nickel (Ni), cobalt (Co) and/or molybdenum (Mo) and the second metal layer may be nickel-gold (Ni/Au), nickel-silver (Ni/Ag), aluminum (Al) and/or copper (Co). The metal layers make an electrical contact with the portion of the epitaxial deposited semiconductor layer between the plurality of trenches. The metal layers are electrically isolated from the control gate regions by the gate insulator regions. The metal layer may also make an electrical contact with the gate interconnect in the periphery region. At 470, a third photo-resist may be deposited and patterned by any well-known lithography process to form an anode contact resist layer. In one implementation, the anode contact resist layer defines a combined anode and anode contact. If a gate interconnect is formed in the periphery of the device, the anode contact resist layer may also define a separate control gate contact. At 475, the metal layers exposed by the anode contact resist layer may be etched by any well-known etching method to form a combined anode and anode contact. The metal layers may also be patterned to form a control gate contact in the periphery region of the device. At 480, the anode contact resist layer may be removed utilizing an appropriate resist stripper or resist ashing process.

It is appreciated that the substrate should be as thin as possible to reduce the on-state resistance of the Schottky barrier rectifier. Accordingly, the substrate may be thinned by a process such as back lapping (e.g., chemical-mechanical polishing and/or etching), at optional process 485 of FIG. 4C. Alternatively or in addition to back lapping, the bottom surface of the substrate may be etched to form a plurality of groves. The groves result in a lower on-resistance as a result of the cathode contact, proximate the bottom of the groves, being in closer proximity to the conduction channels. The groves also increase the surface area of the substrate and may therefore provide for increased heat dissipation by the device.

At 490, a third metal layer may be deposited on the backside of the wafer to form a cathode contact. The metal layer may be deposited by any well-known method such as sputtering. In one implementation, the third metal layer may be nickel-gold (Ni/Au), nickel-silver (Ni/Ag) or aluminum (Al). At 495, fabrication continues with various other processes. The various processes typically include passivation, cleaving and/or the like.

Figure 5A:
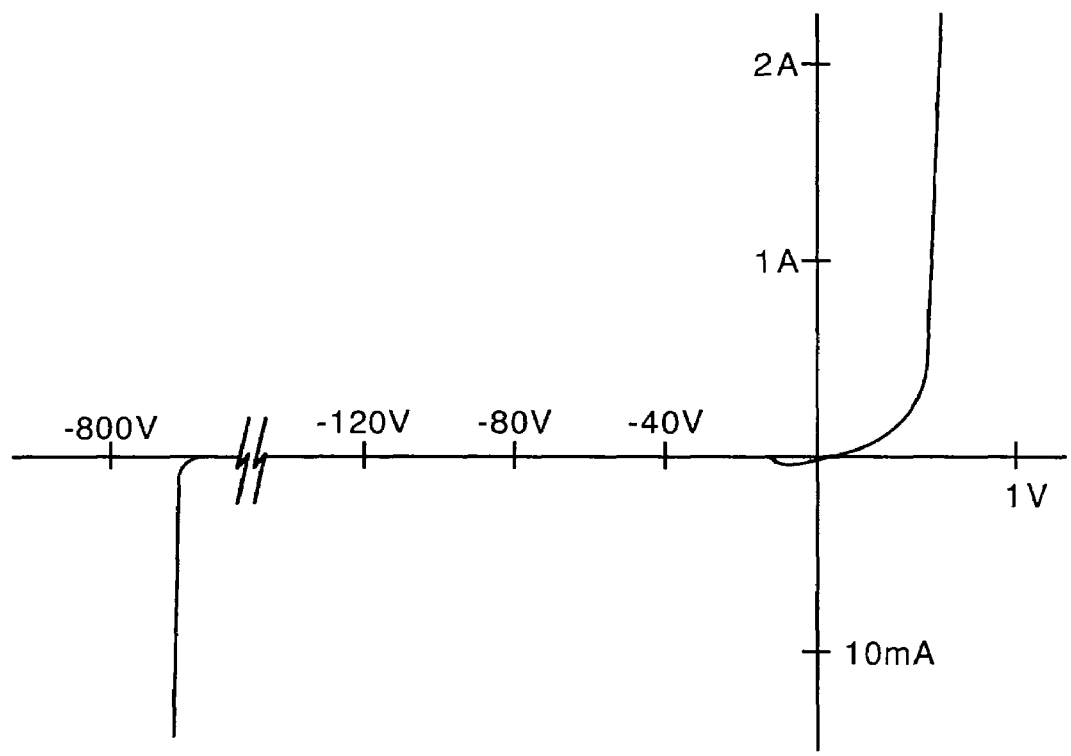
FIG. 5A shows an exemplary plot of the current-voltage characteristics of a depletion mode Schottky barrier rectifier, in accordance with one embodiment of the present invention.

Referring now to FIG. 5A, an exemplary plot of the current-voltage characteristics of a depletion mode gate controlled Schottky barrier rectifier, in accordance with one embodiment of the present invention, is shown. It is appreciated that the plots are for illustrative purposes and do not necessarily represent a particular Schottky barrier rectifier. As depicted in FIG. 5A, the depletion mode Schottky barrier rectifier exhibits a relatively low voltage drop, approximately 0.5V, when forward-biased and conducting relatively large currents. The device also exhibits a relatively large breakdown voltage, approximately −30V to −800V. For example, a moderate doping of approximately 1.0E16 of the portion of the cathode proximate the anode and the control gate (e.g., second doped region, epitaxial deposited semiconductor layer) that is approximately 30 nm thick may be adapted to provide a breakdown voltage of approximately −40V. A moderate doping of approximately 1.0E15 of the portion of the cathode proximate the anode and the control gate that is approximately 200 nm thick may be adapted to provide a breakdown voltage of approximately −300V. A moderate doping of approximately 5.0E14 of the portion of the cathode proximate the anode and the control gate that is approximately 300 nm thick may be adapted to provide a breakdown voltage of approximately −600V.

There is virtually no leakage current when the reverse-bias voltage is less than the breakdown voltage. However, it should be noted that for the depletion mode device, the leakage current is substantially a function the leakage current characteristic of the Schottky diode when the reverse-bias voltage is between 0V and approximately −2V. It is appreciated that the range of low reverse-bias voltage at which the leakage current is related to the leakage current of the Schottky barrier is dependent on device design parameters. The amount of the leakage current at relatively low reverse-bias voltage is also a function of the device design parameters. As the reverse-bias voltage increases, the conduction channel is pinched-off and the leakage current of the depletion mode device actually improves.

Figure 5B:
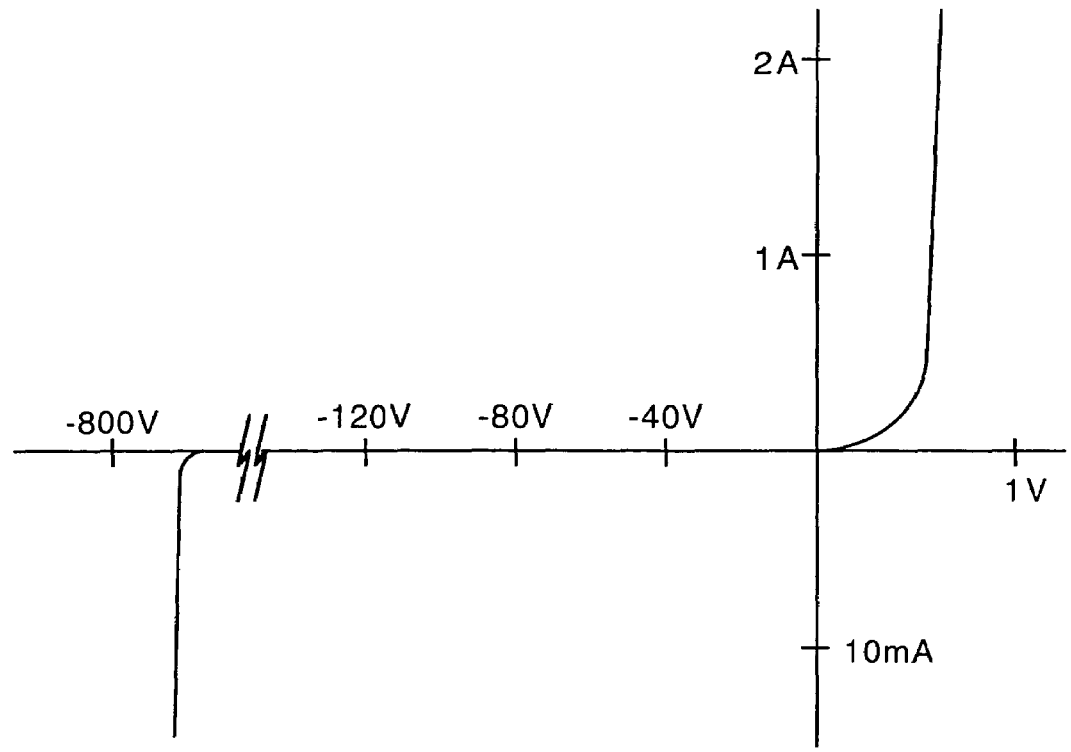
FIG. 5B shows an exemplary plot of the current-voltage characteristics of an enhancement mode Schottky barrier rectifier, in accordance with one embodiment of the present invention.

Referring now to FIG. 5B, an exemplary plot of the current-voltage characteristics of an enhancement mode Schottky barrier rectifier, in accordance with one embodiment of the present invention, is shown. It is appreciated that the plots are for illustrative purposes and do not necessarily represent a particular Schottky barrier rectifier. As depicted in FIG. 5B, the enhancement mode gate controlled Schottky barrier rectifier exhibits a relatively low voltage drop, approximately 0.5V, when forward-biased and conducting relatively large currents. The device also exhibits a relatively large breakdown voltage, approximately −30V to −800V. For example, a moderate doping of approximately 1.0E16 of the portion of the cathode proximate the anode and the control gate (e.g., second doped region, epitaxial deposited semiconductor layer) that is approximately 30 nm thick may be adapted to provide a breakdown voltage of approximately −40V. A moderate doping of approximately 1.0E15 of the portion of the cathode proximate the anode and the control gate that is approximately 200 nm thick may be adapted to provide a breakdown voltage of approximately −300V. A moderate doping of approximately 5.0E14 of the portion of the cathode proximate the anode and the control gate that is approximately 300 nm thick may be adapted to provide a breakdown voltage of approximately −600V. There is virtually no leakage current when the reverse-bias voltage is less than the breakdown voltage.

Accordingly, embodiments of the present invention provide an improved Schottky barrier rectifier and a method of manufacturing the same. The device includes a Schottky barrier formed proximate an interface between an anode, of conductive material, and a cathode, of semiconductor material. A plurality of control gate structures are disposed in the cathode, such that a plurality of conduction channels formed there between may be selectively pinched off as a function of a potential between the control gate and the cathode. When conduction channels are present between the control gates and the Schottky barrier is forward-biased, an "on-state" current flows. When the conduction channels are "pinched-off" and the Schottky barrier is reverse-biased, the "off-state" current is substantially zero. Thus, the control gate selectively blocks the leakage current when the Schottky barrier is reverse-biased at a potential less than a breakdown voltage. The control gate is also advantageously adapted to increase the breakdown voltage of the Schottky barrier rectifier, as compared to a Schottky diode and a p-n junction diode. In addition, the voltage drop across the device is substantially equal to the voltage drop across the Schottky barrier when forward-biased.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A rectifier comprising:
   a first conductive layer;
   a first doped region of a semiconductor heavily doped with a first dopant type;
   a second doped region of said semiconductor, moderately doped with said first dopant type, disposed between said first conductive layer and said first doped region, wherein a Schottky barrier is formed proximate an interface between said second doped region and said first conductive layer; and
   a plurality of third doped regions disposed in said second doped region;
   wherein the plurality of third doped regions comprise substantially concentric rings in the second doped region and the plurality of third doped regions are spaced apart from the Schottky barrier and the first conductive layer.

2. The rectifier according to claim 1, wherein said first conductive layer comprises:
   a first layer of one or more metals selected from the group consisting of titanium, tungsten, platinum, copper, nickel, cobalt and molybdenum, disposed upon said second doped region; and
   a second layer of one or more metals selected from the group consisting of aluminum, copper, gold, silver and nickel, disposed upon said first layer.

3. The rectifier according to claim 2, wherein said first conductive layer further comprises a third layer of one or more metals selected from the group consisting of titanium and tungsten, disposed between said first layer and said second layer.

4. The rectifier according to claim 1, further comprising a second conductive layer disposed upon said first doped region opposite said second doped region.

5. The rectifier according to claim 4, wherein said second conductive layer comprises one or more metals selected from the group consisting of aluminum, nickel, silver and titanium.

6. The rectifier according to claim 1, wherein:
   said first doped region comprises silicon heavily doped with phosphorous or arsenic;
   said second doped region comprises silicon moderately doped with phosphorous or arsenic; and
   said plurality of third doped regions comprise silicon doped with boron.

7. The rectifier according to claim 1, further comprising a plurality of insulator regions disposed in said second doped region, wherein each insulator region is disposed between a corresponding one of said plurality of third doped regions and said first conductive layer.

8. The rectifier according to claim 1, wherein a plurality of depletion regions associated with said plurality of third doped regions do not overlap in said second doped region, when said rectifier is in an equilibrium state.

9. The rectifier according to claim 8, wherein a plurality of conduction channels between said first conductive layer and said first doped region are present between said plurality of depletion regions when said plurality of third doped regions are forward-biased with respect to said first doped region.

10. The rectifier according to claim 9, wherein said plurality of conduction channels are pinched off when said plurality of third doped regions are reverse-biased with respect to said first doped region.

11. The rectifier according to claim 1, wherein a plurality of depletion regions associated with said plurality of third doped regions merge to form a single continuous depletion region across said second doped region when said rectifier is in an equilibrium state.

12. The rectifier according to claim 11, wherein a plurality of conduction channels between said first conductive layer and said first doped region are present between said plurality of depletion regions when said plurality of third doped regions are forward-biased with respect to said first doped region.

13. The rectifier according to claim 11, wherein said plurality of conduction channels are pinched off when said plurality of third doped regions are reverse-biased with respect to said first doped region.

14. A rectifier comprising:
   a cathode;
   an anode disposed on said cathode, wherein a Schottky barrier is formed proximate an interface between said cathode and said anode; and
   a control gate comprising a plurality of structures disposed in said cathode for selectively pinching off a conduction channel in said cathode;
   wherein the plurality of control gate structures comprise substantially concentric rings in the cathode.

15. The rectifier according to claim 14, further comprising a plurality of insulation regions, where each one of said insulation regions is disposed between one of said control gate structures and said anode.

16. The rectifier according to claim 14, wherein:
   a conduction channel in said cathode is present in response to a first potential applied to said control gate; and
   said conduction channel is pinched off in response to a second potential applied to said control gate.

17. The rectifier according to claim 14, wherein a plurality of depletion regions associated with said control gate selectively block a leakage current when said Schottky barrier is reverse-biased at a potential less than a breakdown voltage of said Schottky barrier rectifier.

18. The rectifier according to claim 17, wherein said plurality of depletion regions increase said breakdown voltage of said Schottky barrier rectifier as compared to a breakdown voltage of said Schottky barrier.

19. The rectifier according to claim 14, wherein a voltage drop across said Schottky barrier rectifier is substantially equal to a voltage drop across said Schottky barrier when forward-biased.

20. The rectifier according to claim 1, wherein:
   said first doped region comprises silicon heavily doped with boron;
   said second doped region comprises silicon moderately doped with boron; and
   said third doped regions comprise silicon doped with phosphorous or arsenic.

* * * * *